Sept. 7, 1965 D. A. MATHEWS 3,204,418

MULTIVIBRATOR-TYPE CONTROL CIRCUIT FOR THERMOELECTRIC ELEMENTS

Filed Nov. 25, 1964 2 Sheets-Sheet 1

INVENTOR
Donald A. Mathews
BY
Alvin J. Englert
AGENT

INVENTOR

Donald A Mathews

BY Alvin J Englert

AGENT

3,204,418
MULTIVIBRATOR-TYPE CONTROL CIRCUIT FOR THERMOELECTRIC ELEMENTS

Donald A. Mathews, Washington, D.C., assignor to the United States of America as represented by the Secretary of Commerce Filed Nov. 25, 1964, Ser. No. 414,036
8 Claims. (Cl. 62—3)

This invention relates to thermoelectric control circuits, and more particularly to a multivibrator-type control circuit which supplies a thermoelectric element with current in the heating and cooling directions in response to the variations in resistance of a resistance-type sensor associated with the thermoelectric element.

In many applications of thermoelectric elements, it is desired to supply the element with a current having a magnitude and direction that are directly related to the magnitude and direction of the instantaneous deviations of a resistance-type sensor from a preset or predetermined value. Several circuits have been proposed to provide the desired current control; in general, however, these circuits use a large number of expensive components.

A circuit constructed in accordance with the present invention provides the desired current control with a few, inexpensive, reliable components. Briefly, in the present invention the thermoelectric element is arranged to be connected to either a heating or cooling current source by means of a pair of PNPN four-layer diodes. The PNPN diodes are connected into a multivibrator configuration by coupling elements which include the resistance-type sensor associated with the thermoelectric element. The operation of the circuit is such that the relative times that the thermoelectric element is connected to the heating or cooling current sources depend on the instantaneous resistance of the sensor.

Accordingly, it is an object of this invention to provide a thermoelectric control circuit which involves a small number of inexpensive and reliable components.

Another object of this invention is to provide a thermoelectric control circuit which effects close control over the current supplied to the thermoelectric element.

Another object is to provide a fast-responding thermoelectric control circuit.

A further object is to provide a thermoelectric control circuit which supplies the thermoelectric element with current that is proportional to the error detected by the associated sensor.

These and other objects, advantages and features of the present invention will be readily apparent when the following description is read in connection with the drawing, wherein like reference numerals refer to like elements throughout the figures, and wherein.

Figure 1:
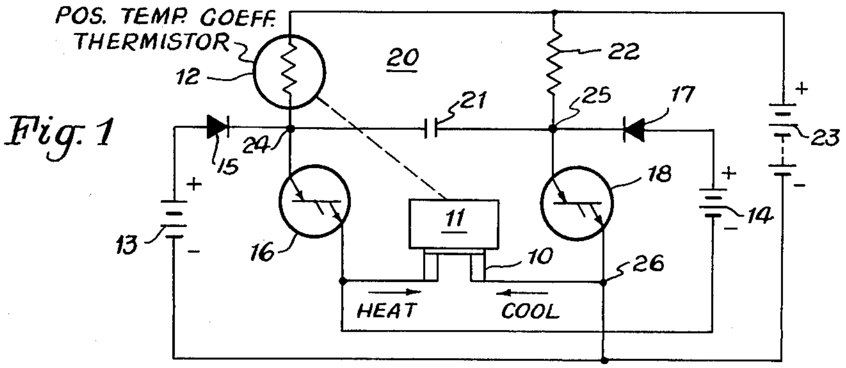
FIG. 1 is a circuit diagram of an illustrative embodiment of the invention.

In the illustrative embodiment of the invention shown in FIG. 1, a thermoelectric element 10 of known construction is thermally connected to a member, enclosure or the like, designated as 11, which is to be maintained at a preset temperature by regulating the current through the thermoelectric element 10. A positive temperature coefficient thermistor 12 is disposed against the member 11, as represented by the dashed line, to sense the temperature of the member 11. The resistance of the thermistor 12 varies directly with the temperature of the member 11, and hence it is desired to maintain the resistance of thermistor 12 at a predetermined value.

In accordance with the present invention, there are provided separate direct-current sources 13, 14 for supplying the thermoelectric element 10 with current in the heating and cooling directions, respectively. The thermoelectric element 10, source 13, a conventional diode 15, and a PNPN four-layer diode 16 are connected in a series circuit so that the current from source 13 flows from left to right (heating direction) through the thermoelectric element 10 when the PNPN diode 16 is "switched closed." In similar fashion, a second conventional diode 17 and a second PNPN diode 18 are connected in series with the thermoelectric device 10 and source 14 so that current from source 14 flows from right to left (cooling direction) when the PNPN diode 18 is "switched closed."

The PNPN diodes 16, 18 are well-known semiconductive switches which close when the voltages thereacross rise above their "switching voltages," and open when the currents therethrough fall below their "holding currents."

To alternately close the PNPN diodes 16, 18 and thereby alternately supply the thermoelectric element 10 with heating and cooling currents, the diodes 16, 18 are interconnected to form a free-running multivibrator circuit 20. The interconnecting elements comprise a capacitor 21, the thermistor 12, a resistor 22, and a direct current source 23. The capacitor 21 is connected between the junction 24 of diodes 15, 16 and the junction 25 of diodes 17, 18. The thermistor 12 and resistor 22 connect the junctions 24 and 25, respectively, to the positive terminal of direct current source 23, the negative terminal of which is connected to the junction 26 of PNPN diode 18 and thermoelectric element 10.

The voltage of source 23 is greater than the "switching voltages" of the PNPN diodes 16, 18 while the voltages of the sources 13, 14 are each less than the "switching voltages." The sources 13, 14 and 23 are arranged to apply forward bias to the PNPN diodes 16, 18. The conventional diodes 15, 17 are provided to isolate the source 23 from the sources 13, 14.

In the operation of the multivibrator circuit 20, the capacitor 21 serves two functions; namely, it allows the PNPN diodes 16 and 18 each to remain closed for times proportional to the resistances of resistor 22 and thermistor 12, respectively, and it switches open whichever of the diodes 16, 18 is closed when the other of the diodes 16, 18 switches closed. For example, let it be assumed that PNPN diode 16 switches closed and diode 18 switches open. When PNPN diode 16 closes, current flows from source 13 through conventional diode 15, PNPN diode 16 and the thermoelectric element 10, causing the element 10 to heat the member 11. At the same time, current flows from source 23 through resistor 22, capacitor 21, PNPN diode 16, and thermoelectric element 10, causing the capacitor 21 to charge towards the voltage of source 23. The voltage across capacitor 21 is essentially applied across the opened PNPN diode 18, since closed diode 16 and thermoelectric element 10 each are very low impedances and appear as connecting wires. The capacitor 21 will charge to the switching voltage of the opened diode 18 in a time that is proportional to the product of the capacitance of capacitor 21 and the resistance of resistor 22. When the voltage on capacitor 21 reaches the switching voltage of PNPN diode 18, diode 18 closes, causing the voltage at junction 25 to drop to zero with respect to the negative terminal of source 23. Since the voltage across capacitor 21 cannot change instantaneously, the voltage at junction 24 goes negative with respect to the negative terminal of source 23, thereby reverse-biasing the PNPN diode 16, causing it to switch open.

When PNPN diode 16 opens and PNPN diode 18 closes, current from source 14 flows through conventional diode 17, closed PNPN diode 18, and the thermoelectric element 10, causing it to cool the member 11. Simultaneously, current flows from source 23 through thermistor 12, capacitor 21 and closed PNPN diode 18, causing the capacitor 21 to charge towards the voltage of source 23. The voltage on capacitor 21 is essentially applied across the opened PNPN diode 16, since the closed diode 18 and thermoelectric element 10 are very low impedances. When the voltage on capacitor 21 reaches the switching voltage of PNPN diode 16, after a time that is proportional to the product of the capacitance of capacitor 21 and the resistance of thermistor 12, diode 16 closes, causing the voltage at junction 24 to fall to zero, and the voltage at junction 25 to go negative and thereby open the closed PNPN diode 18. With diode 16 switching closed and diode 18 switching open, the multivibrator circuit 20 returns to the previously-assumed condition. As will readily be appreciated, the circuit 20 therefore will continue to oscillate in the above-described manner.

From the foregoing, it will be seen that PNPN diode 16 periodically is closed for a relative time that is proportional to the resistance of resistor 22, while the diode 18 is alternately closed for a relative time that is proportional to the resistance of thermistor 12. Since the diodes 16 and 18 close the heating and cooling circuits, respectively, to thermoelectric element 10, the relative heating and cooling periods of the element 10 are proportional to the resistances 22 and 12, respectively.

Figure 2:
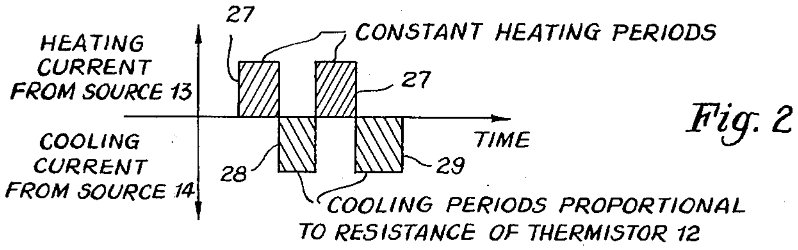
FIG. 2 is a graph of the current pulses supplied to the thermoelectric element in FIG. 1.

Resistor 22 is constant in value, and consequently the heating periods of the thermoelectric element 10 are constant in time width or time span, as illustrated by the constant heating periods 27 in FIG. 2. The resistance of thermistor 12, on the other hand, varies directly with the temperature of member 11, whereby the cooling periods of the thermoelectric element 10 are proportional to the temperature of member 11. Thus, if external heat sources tend to raise the temperature of member 11 from a preset temperature, the cooling periods of thermoelectric element 10 will tend to increase and thereby offset the effect of the external heat sources on member 11. This effect is illustrated in FIG. 2, where cooling period 29 is longer than the previous cooling period 28, due to the increased resistance of thermistor 12. In FIG. 2, only four current pulses are shown, although it will be understood that the thermoelectric element 10 is continuously supplied with such pulses.

To summarize circuit 20 of FIG. 1, it may be stated that the thermoelectric element 10 periodically is supplied with constant time width pulses of current 27, FIG. 2, from source 13 to heat the member 11. After each heating pulse 27, the thermoelectric element 10 is supplied with pulses of current such as 28, 29, having sufficient time widths to maintain the member 11 at a preset temperature.

As will readily be apparent, the thermoelectric heating and cooling rates of the thermoelectric element 10 can each be adjusted to a desired value by appropriately selecting the voltages of the sources 13, 14, respectively. If the thermoelectric heating and cooling rates are made approximately equal to the maximum expected rates of the external heating and cooling influences on member 11, the circuit 20 will be capable of quickly offsetting the external influences.

To avoid having the thermoelectric element 10 continually overheat and overcool the member 11, the resistances 12, 22 together with the capacitor 21 should be selected to provide heating and cooling periods that are small enough to be readily integrated by the thermal mass of member 11.

To set the desired temperature of the member 11, the resistance of thermistor 12 is selected so that its resistance at the desired temperature produces repeated cooling periods that effect sufficient cooling of the member 11 to cancel out the heating of member 11 provided by the constant heating periods. This preset temperature can then conveniently be varied by varying the resistance of the resistor 22, which can take the form of a rheostat or potentiometer (not shown).

In the analysis of the operation of the circuit 20, the capacitor 21 was described as charging through the resistors 11 or 22 towards the voltage of source 23. The capacitor 21 also tends to charge through the diodes 15, 17 towards the voltages of the sources 13, 14, since these sources are in parallel with source 23. Since the voltages of sources 13, 14 generally are very much less than the voltage of source 23, the charging of capacitor 21 due to sources 13, 14 is negligible and does not affect the heating and cooling periods of thermoelectric element 10. If desired, sufficient resistances (not shown) may be connected in series with each of the heating and cooling current sources 13, 14 to minimize their capacitor charging effects.

Figure 3:
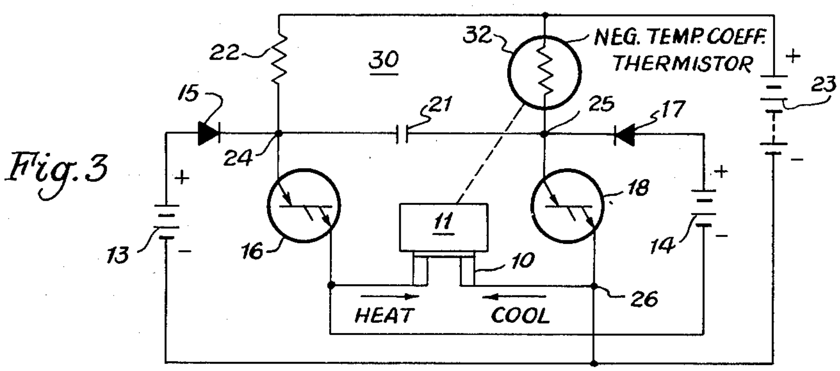
FIG. 3 is a circuit diagram of an alternative embodiment of the invention.

In the alternative illustrative embodiment of the invention shown in FIG. 3, a negative temperature coefficient thermistor 32 is used to sense the temperature of the member 11. The resistance of thermistor 32 varies inversely with the temperature of member 11, and consequently, the positions of thermistor 32 and resistor 22 are interchanged with respect to the positions of the positive temperature coefficient thermistor 12 and resistor 22 shown in FIG. 1. In FIG. 3, thermistor 32 is connected between the junction 25 of the multivibrator circuit 30 of the present invention and the positive terminal of source 23, while resistor 22 is connected between junction 24 and the positive terminal of source 23.

Figure 4:
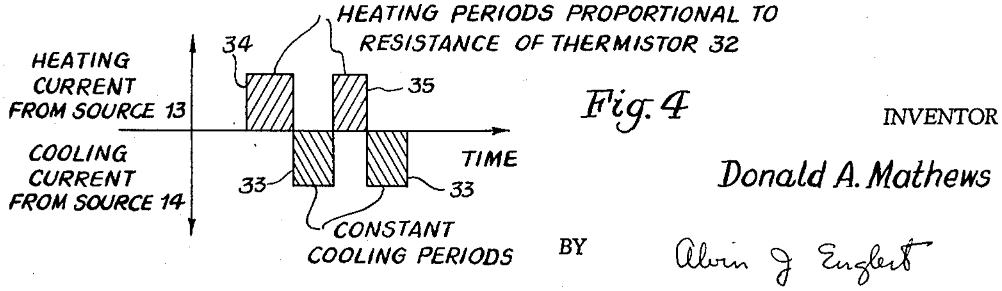
FIG. 4 is a graph of the current pulses supplied to the thermoelectric element in FIG. 3.

The operation of multivibrator circuit 30 of FIG. 3 is identical with that of multivibrator circuit 20; consequently, it will be observed that the PNPN diode 16 periodically will close for a relative time that is proportional to the resistance of thermistor 32, and PNPN diode 18 alternately will close for a relative time that is proportional to the resistance of resistor 22. Since diodes 16 and 18 connect the heating and cooling current sources 13, 14, respectively, to the thermoelectric element 10, the heating and cooling periods of thermoelectric element 10 will be proportional to the resistances 32 and 22, respectively. The resistance of resistor 22 is constant, and hence the cooling periods are constant, as illustrated by the constant cooling periods 33 of FIG. 4. Since the resistance of thermistor 32 varies inversely with the temperature of member 11, the resistance thereof will decrease if the temperature of member 11 tends to increase because of external influences. The decrease in resistance of thermistor 32 therefore will cause a decrease in the heating periods, as shown in FIG. 4, where heating periods 34 and 35 are decreasing in time. The resultant decrease in thermoelectric heating of member 11 will thereby offset the external heating of member 11, causing the member 11 to remain at the preset temperature.

Figure 5:
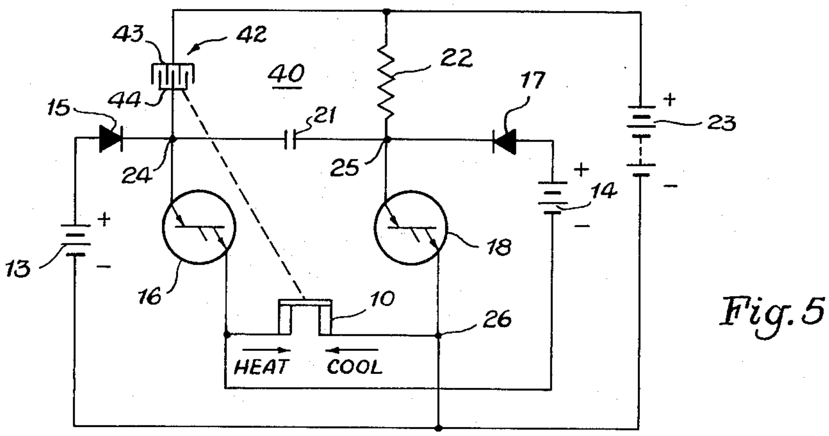
FIG. 5 is a circuit diagram of another illustrative embodiment of the invention.
Figure 6:
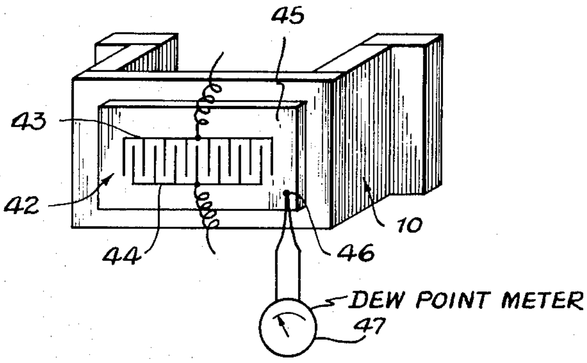
FIG. 6 is a perspective view of the dew sensor and thermoelectric element of FIG. 5.
Figure 7:
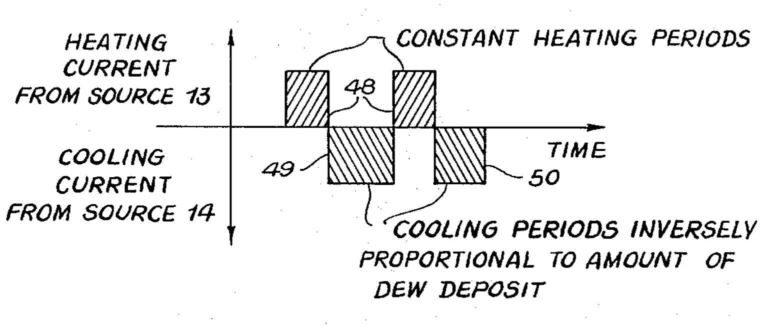
FIG. 7 is a graph of the current pulses supplied to the thermoelectric element of FIG. 5.

In the illustrative embodiment of the invention shown in FIGS. 5–7, the thermoelectric element 10 is associated with a dew deposit sensor 42 so as to provide a dewpoint measuring system. The dew deposit sensor 42 comprises a pair of interleaved comb-like conductors 43, 44 that are printed, etched or otherwise formed on a thin insulating base plate 45, FIG. 6. The base plate 45 is mounted in any convenient manner on the thermoelectric element 10. Disposed on the base plate 45 is a thermocouple 46 or the like for measuring the temperature of the dew sensor 42. The thermocouple 46 is connected to any suitable meter means 47 for displaying or otherwise using the temperature measurement.

The resistance between the conductors 43, 44 of the dew sensor 42 is very high until the sensor is cooled, by the thermoelectric element 10, to the dewpoint of the surrounding air. When the dewpoint is reached, dew deposits on and between the conductors 43, 44, providing a conductive bridge therebetween. The resistance between the conductors 43, 44 is then inversely proportional to the amount of the dew deposit.

As shown in FIG. 5, the dew sensor 42 is connected between the junction 24 of the multivibrator circuit 40 of the present invention and the position terminal of the source 23; resistor 22 is connected between junction 25 and the positive terminal of source 23. The multivibrator circuit 40 operates in the same manner as multivibrator circuit 20, from which it follows that the heating periods of the thermoelectric element 10 are proportional to the resistance of resistor 22, while the cooling periods are proportional to the resistance of the dew sensor 42. Accordingly, the heating periods are constant, as shown at 48 in FIG. 7, and the cooling periods 49, 50 are inversely proportional to the amount of dew deposited on the sensor 42. Thus, when little or no dew is present on the sensor 42, the cooling periods of the thermoelectric element 10 are prolonged, until the dewpoint is reached. The deposition of dew on sensor 42 tends to decrease the cooling periods, and a steady state condition ensues wherein a predetermined small amount of dew is present to maintain a predetermined sensor resistance. The circuit 40 will operate to change the temperature of the dew sensor 42 as necessary to maintain the predetermined small amount of dew. In this manner, the temperature of the sensor 42, as measured by the thermocouple 46, FIG. 6, will always equal the dewpoint temperature of the surrounding air.

From the foregoing, it will readily be appreciated that the sensor used in the multivibrator circuit of the present invention may comprise any of the well-known resistive devices that are sensitive to temperature or a temperature-dependent condition such as pressure, voltage and the like, whereby the circuit 20 will operate to maintain a preset temperature or condition. A specific example of another sensor that may be employed in the circuit is the well-known dew cell comprising a temperature-controlled saturated salt solution.

To those skilled in the art, many modifications and variations of the above specific illustrative embodiments of the present invention will be obvious, and it is therefore intended that the invention include all such modifications and variations as fall within the scope of the appended claims.

What is claimed is:

1. A multivibrator-type thermoelectric element control circuit comprising, a thermoelectric element, a member arranged to be heated and cooled by said thermoelectric element, a resistance-type sensor disposed on said member, first and second direct current sources for supplying said thermoelectric element with current in the heating and cooling directions, respectively, free-running multivibrator means for connecting said first source to said thermoelectric element for first periods of time and alternately connecting said second source to said thermoelectric element for second periods of time, one of said periods being constant, the other of said periods being proportional to the resistance of said sensor.

2. A circuit as set forth in claim 1, wherein said sensor comprises a positive temperature coefficient thermistor, and said first periods are constant.

3. A circuit as set forth in claim 1, wherein said sensor comprises a negative temperature cofficient thermistor, and said second periods are constant.

4. A circuit as set forth in claim 1, wherein said sensor comprises a dew sensor which provides a resistance inversely proportional to the amount of dew deposited thereon, said first periods being constant, and means for measuring the temperature of said dew sensor, whereby the measured temperature is the dewpoint of the air surrounding said dew sensor.

5. A circuit as set forth in claim 1, wherein said multivibrator means comprises a first PNPN diode and a first conventional diode connected in series with said first source and said thermoelectric element, a second PNPN diode and a second conventional diode connected in series with said second source and said thermoelectric element, a capacitor connected between a first junction of said first PNPN diode and said first conventional diode and a second junction of said second PNPN diode and said second conventional diode, a third direct current source, a resistor and said sensor each connected between one of said first and second junctions and the positive terminal of said third source, the negative terminal of said third source being connected to one end of said thermoelectric element.

6. A circuit as set forth in claim 5, wherein said sensor comprises a positive temperature coefficient thermistor connected between said first junction and said positive terminal of said third source.

7. A circuit as set forth in claim 5, wherein said sensor comprises a negative temperature coefficient thermistor connected between said second junction and said positive terminal of said third source.

8. A circuit as set forth in claim 5, wherein said sensor comprises a dew sensor which provides a resistance inversely proportional to the amount of dew deposited thereon, said dew sensor being connected between said first junction and said positive terminal of said third source, and means for measuring the temperature of said dew sensor, whereby the measured temperature is the dewpoint of the air surrounding said dew sensor.

References Cited by the Examiner

UNITED STATES PATENTS

| | | | |
|---|---|---|---|
| 2,975,638 | 3/61 | Morrison | 62—3 |
| 2,979,950 | 4/61 | Leone | 73—336.5 |
| 2,984,729 | 5/61 | Hykes | 219—20 |
| 3,031,855 | 5/62 | Martz | 62—3 |
| 3,111,008 | 11/63 | Nelson | 62—3 |
| 3,112,648 | 12/63 | Dulk | 73—336.5 |
| 3,166,928 | 1/65 | Jackson | 73—17 |

WILLIAM J. WYE, *Primary Examiner.*